(12) United States Patent
Sugishita

(10) Patent No.: US 11,443,985 B2
(45) Date of Patent: Sep. 13, 2022

(54) DISCRETE PIECE FORMING DEVICE AND DISCRETE PIECE FORMING METHOD

(71) Applicant: LINTEC CORPORATION, Tokyo (JP)

(72) Inventor: Yoshiaki Sugishita, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 76 days.

(21) Appl. No.: 17/033,657

(22) Filed: Sep. 25, 2020

(65) Prior Publication Data

US 2021/0020512 A1 Jan. 21, 2021

Related U.S. Application Data

(63) Continuation of application No. PCT/JP2018/047262, filed on Dec. 21, 2018.

(30) Foreign Application Priority Data

Mar. 29, 2018 (JP) .............................. JP2018-063687

(51) Int. Cl.
*H01L 21/78* (2006.01)
*H01L 21/50* (2006.01)
*H01L 21/683* (2006.01)

(52) U.S. Cl.
CPC .............. *H01L 21/78* (2013.01); *H01L 21/50* (2013.01); *H01L 21/6836* (2013.01); *H01L 2221/68381* (2013.01)

(58) Field of Classification Search
CPC ..... H01L 21/78; H01L 21/50; H01L 21/6836; H01L 2221/68381; H01L 21/67092;
(Continued)

(56) References Cited

U.S. PATENT DOCUMENTS 7,101,620 B1* 9/2006 Poddar ................ H01L 21/6836
257/783
7,446,022 B2* 11/2008 Yoshikawa ............ B23K 26/40
438/463
(Continued)

FOREIGN PATENT DOCUMENTS

JP H07278333 A 10/1995
JP 2001123002 A 5/2001
(Continued)

OTHER PUBLICATIONS

Related U.S. Appl. No. 17/033,609; First Named Inventor: Yoshiaki Sugishita; Title: "Discrete Piece Manufacturing Method"; filed Sep. 25, 2020.
(Continued)

*Primary Examiner* — Vu A Vu
(74) *Attorney, Agent, or Firm* — Holtz, Holtz & Volek PC

(57) ABSTRACT

A discrete piece forming device that forms discrete pieces by dividing a work. The device includes a modified part forming unit which forms modified parts in the work having a pre-pasted adhesive sheet containing swell grains which swell by application of a predetermined energy, to form, in the work, predefined discrete piece areas each surrounded by the modified parts. The device further includes a dividing unit which divides the work into pieces by forming, in the work, cracks starting from the modified parts by applying external force to the work, to form the discrete pieces. The dividing unit applies the energy to parts of the adhesive sheet to swell the swell grains contained in adhesive sheet parts to which the energy has been applied, thereby displacing the predefined discrete piece areas pasted on the adhesive sheet parts to form the discrete pieces.

26 Claims, 7 Drawing Sheets

(58) Field of Classification Search
CPC . H01L 2221/68322; H01L 2221/68327; H01L 21/6835; H01L 21/302; H01L 21/67115; H01L 2221/68318; B23K 26/53; B23K 2103/56
USPC .......................................................... 438/113
See application file for complete search history.

(56) References Cited

U.S. PATENT DOCUMENTS

| | | |
|---|---|---|
| 2006/0257651 A1 | 11/2006 | Shintani et al. |
| 2007/0224378 A1 | 9/2007 | Takeuchi et al. |
| 2012/0028442 A1 | 2/2012 | Takamoto et al. |
| 2013/0029147 A1 | 1/2013 | Miki et al. |
| 2013/0137219 A1 | 5/2013 | Senzai et al. |
| 2013/0199732 A1 | 8/2013 | Niwa et al. |
| 2013/0323907 A1 | 12/2013 | Oosterhuis et al. |
| 2016/0218039 A1 | 7/2016 | Meyer-Berg et al. |

FOREIGN PATENT DOCUMENTS

| | | |
|---|---|---|
| JP | 2003261842 A | 9/2003 |
| JP | 2003282629 A | 10/2003 |
| JP | 2007214457 A | 8/2007 |
| JP | 2007254580 A | 10/2007 |
| JP | 2008132710 A | 6/2008 |
| JP | 2011212528 A | 10/2011 |
| JP | 2012033636 A | 2/2012 |
| JP | 2012167151 A | 9/2012 |
| JP | 2013047321 A | 3/2013 |
| JP | 2013115185 A | 6/2013 |
| JP | 2013159743 A | 8/2013 |
| JP | 2013543262 A | 11/2013 |
| JP | 2014086611 A | 5/2014 |
| JP | 2015211080 A | 11/2015 |
| JP | 2016053115 A | 4/2016 |
| JP | 2016081974 A | 5/2016 |
| JP | 2017103362 A | 6/2017 |
| KR | 20120119059 A | 10/2012 |
| TW | 200641085 A | 12/2006 |
| TW | 201809218 A | 3/2018 |
| WO | 2018181765 A1 | 10/2018 |

OTHER PUBLICATIONS

Related U.S. Appl. No. 17/092,285; First Named Inventor: Yoshiaki Sugishita; Title: "Discrete Piece Forming Device and Discrete Piece Forming Method"; filed Nov. 8, 2020.
International Search Report (ISR) (and English translation thereof) dated Mar. 19, 2019 issued in International Application No. PCT/JP2018/047262.
Written Opinion dated Mar. 19, 2019 issued in International Application PCT/JP2018/047262.
Related U.S. Appl. No. 17/130,608; First Named Inventor: Yoshiaki Sugishita; Title: "Mounting Method of Work"; filed Dec. 22, 2020.
Taiwanese Office Action dated Mar. 29, 2022, issued in counterpart Taiwanese Application No. 107147473.

* cited by examiner

DISCRETE PIECE FORMING DEVICE AND DISCRETE PIECE FORMING METHOD

BACKGROUND OF THE INVENTION

Field of the Invention

The present invention relates to a discrete piece forming device and a discrete piece forming method, and for example, relates to a device and a method for forming many discrete pieces by dividing a work such as a semiconductor wafer into small pieces.

Description of the Related Art

Examples of a discrete piece forming device include a device that divides a work such as a semiconductor wafer along modified parts formed in the work, into pieces to form discrete pieces. This device forms die bond chips (discrete pieces) by dividing the work into pieces along the modified parts by pulling a dicing tape pasted on the work.

SUMMARY OF THE INVENTION

The present invention disclosed and claimed herein, in one aspect thereof, comprises a discrete piece forming device. The device comprises:

a modified part forming unit which forms a modified part in a work having a pre-pasted adhesive sheet containing a swell grain that is swollen by the application of predetermined energy, to form, in the work, a predefined discrete piece area surrounded by the modified part or surrounded by the modified part and an outer edge of the work; and a dividing unit which divides the work into pieces by forming, in the work, a crack starting from the modified part by applying external force to the work, to form a discrete piece, wherein the dividing unit applies the energy to part of the adhesive sheet to swell the swell grain contained in an adhesive sheet part to which the energy has been applied, thereby displacing the predefined discrete piece area pasted on the adhesive sheet part to form the discrete piece.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings.

DETAILED DESCRIPTION

Figure 1A:
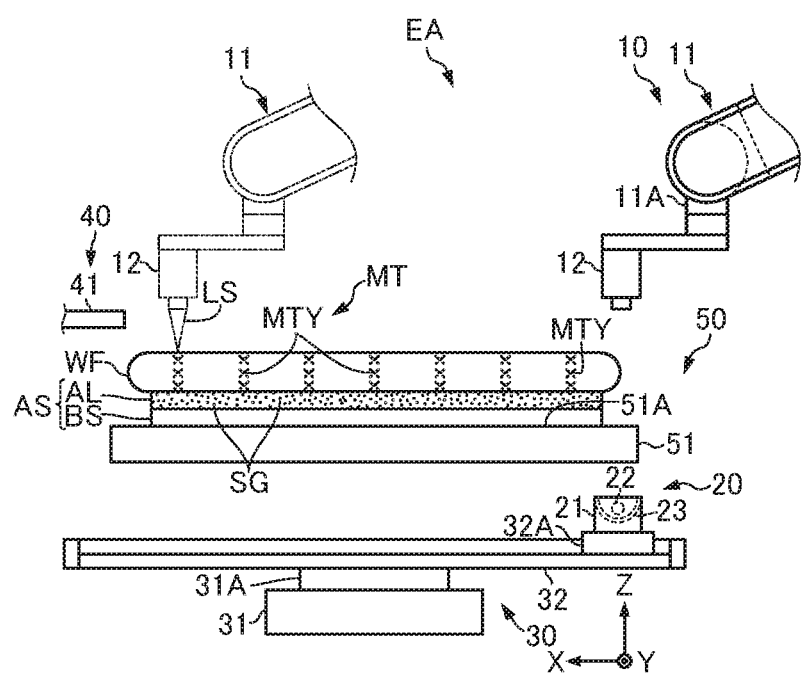
FIG. 1A is an explanatory view of a discrete piece forming device according to one embodiment.

An embodiment will be hereinafter described with reference to the drawings.

It should be noted that X-axis, Y-axis, and Z-axis in the embodiment are orthogonal to one another, where the X-axis and Y-axis are within a predetermined plane while the Z-axis is orthogonal to the predetermined plane. Further, in the embodiment, FIG. 1A as viewed from the near side in terms of the direction parallel to the Y-axis is used as a reference for direction, and when a direction is mentioned without any designation of a drawing, an "upper" direction means a direction indicated by an arrow along the Z-axis, a "lower" direction means a direction opposite the upper direction, a "left" direction means a direction indicated by an arrow along the X-axis, a "right" direction means a direction opposite the "left" direction, a "front" direction means a direction toward the near side in FIG. 1A in terms of a direction parallel to the Y-axis, and a "rear" direction means a direction opposite the "front" direction.

A discrete piece forming device EA divides a semiconductor wafer (hereinafter, also referred to simply as a "wafer") WF as a work into pieces to form semiconductor chips (hereinafter, also referred to simply as "chips") CP as discrete pieces, and includes: a modified part forming unit 10 which forms modified parts MT in the wafer WF to form, in the wafer WF, predefined discrete piece areas WFP each surrounded by the modified parts MT; a dividing unit 20 which divides the wafer WF into pieces by forming, in the wafer WF, cracks CK starting from the modified parts MT by applying external force to the wafer WF, to form the chips CP; a moving unit 30 which relatively moves the wafer WF and the dividing unit 20; and a displacement inhibiting unit 40 which inhibits the displacement of parts, of the wafer WF, that have not yet been displaced by the dividing unit 20. The discrete piece forming device EA is disposed near a wafer support unit 50 supporting the wafer WF.

Note that, on the wafer WF, an adhesive sheet AS containing swell grains SG that swell when infrared rays IR are applied as predetermined energy is pasted beforehand. Further, in this embodiment, the adhesive sheet AS includes a base BS and an adhesive layer AL, and only the adhesive layer AL contains the swell grains SG.

The modified part forming unit 10 includes: what is called a multi-joint robot 11 as a drive device composed of a plurality of arms and capable of displacing an object supported by its tip arm 11A, which is a working part, to any position or any angle in its work range; and a laser irradiator 12 which is supported by the tip arm 11A and exposes the wafer WF to laser LS radiation to form the modified parts MT. The modified part forming unit 10 forms first modified parts MTY extending along the Y-axis direction as a first direction and second modified parts MTX extending along the X-axis direction as a second direction intersecting with the Y-axis direction, to form is predefined discrete piece areas WFP each surrounded by the first modified parts MTY and the second modified parts MTX. Examples of the multi joint robot 11 include the multi-joint robot 111 exemplified in Japanese Patent Application Laid-open No. 2016-81974 which is explicitly incorporated in the present specification by reference.

The dividing unit 20 includes a light source box 21 supported by the moving unit 30, a light emitter 22 which is supported in the light source box 21 and emits infrared rays IR, and a condenser plate 23 which condenses the infrared rays IR emitted by the light emitter 22. The dividing unit 20 is capable of forming a line-shaped application area LG in which an application area of the infrared rays IR extends in a predetermined direction, at a position to which the infrared rays IR are applied, and applies the infrared rays IR to parts of the adhesive sheet AS to swell the swell grains SG contained in adhesive sheet parts ASP to which the infrared rays IR have been applied, thereby displacing the predefined discrete piece areas WFP pasted on the adhesive sheet parts ASP to form the chips CP.

The moving unit 30 includes a rotary motor 31 as a drive device and a linear motor 32 as a drive device which is supported by an output shaft 31A of the rotary motor 31 and whose slider 32A supports the light source box 21. The moving unit 30 moves the line-shaped application area LG formed by the dividing unit 20 to make it parallel to the Y-axis direction and further moves the line-shaped application area LG to make it parallel to the X-axis direction.

The displacement inhibiting unit 40 includes a hold plate 41 supported by a tip arm of a not-illustrated drive device equivalent to the multi-joint robot 11.

The wafer support unit 50 includes a support table 51 having a support surface 51A on which the wafer WF can be held by being sucked by a not-illustrated pressure-reducing unit (holding unit) such as a pressure-reducing pump or a vacuum ejector, and capable of transmitting the infrared rays IR.

The operation of the above-described discrete piece forming device EA will be described.

Figure 1B:
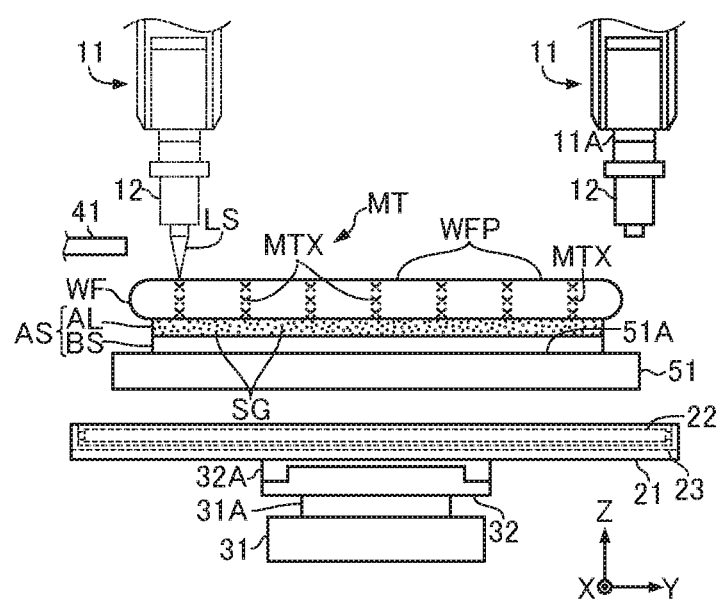
FIG. 1B is an explanatory view of the discrete piece forming device according to the embodiment.

First, in the state in which the members of the discrete piece forming device EA are arranged at initial positions indicated by the solid lines in FIG. 1A, a user of the discrete piece forming device EA (hereinafter, referred to simply as a "user") or a not-illustrated carrier unit such as a multi-joint robot or a belt conveyor places the wafer WF having the adhesive sheet AS pasted thereon, on the support table 51. Then, the wafer support unit 50 drives the not-illustrated pressure-reducing unit to start the suction-holding of the wafer WF on the support surface 51A. Next, the modified part forming unit 10 drives the multi joint robot 11 and the laser irradiator 12, and moves the laser irradiator 12 in the front-rear direction to form the first modified parts MTY in the wafer WF as indicated by the two-dot chain lines in FIG. 1A, and then moves the laser irradiator 12 in the left-right direction to form the second modified parts MTX in the wafer WF as indicated by the two-dot chain lines in FIG. 1B, thereby forming the predefined discrete piece areas WFP.

Figure 1C:
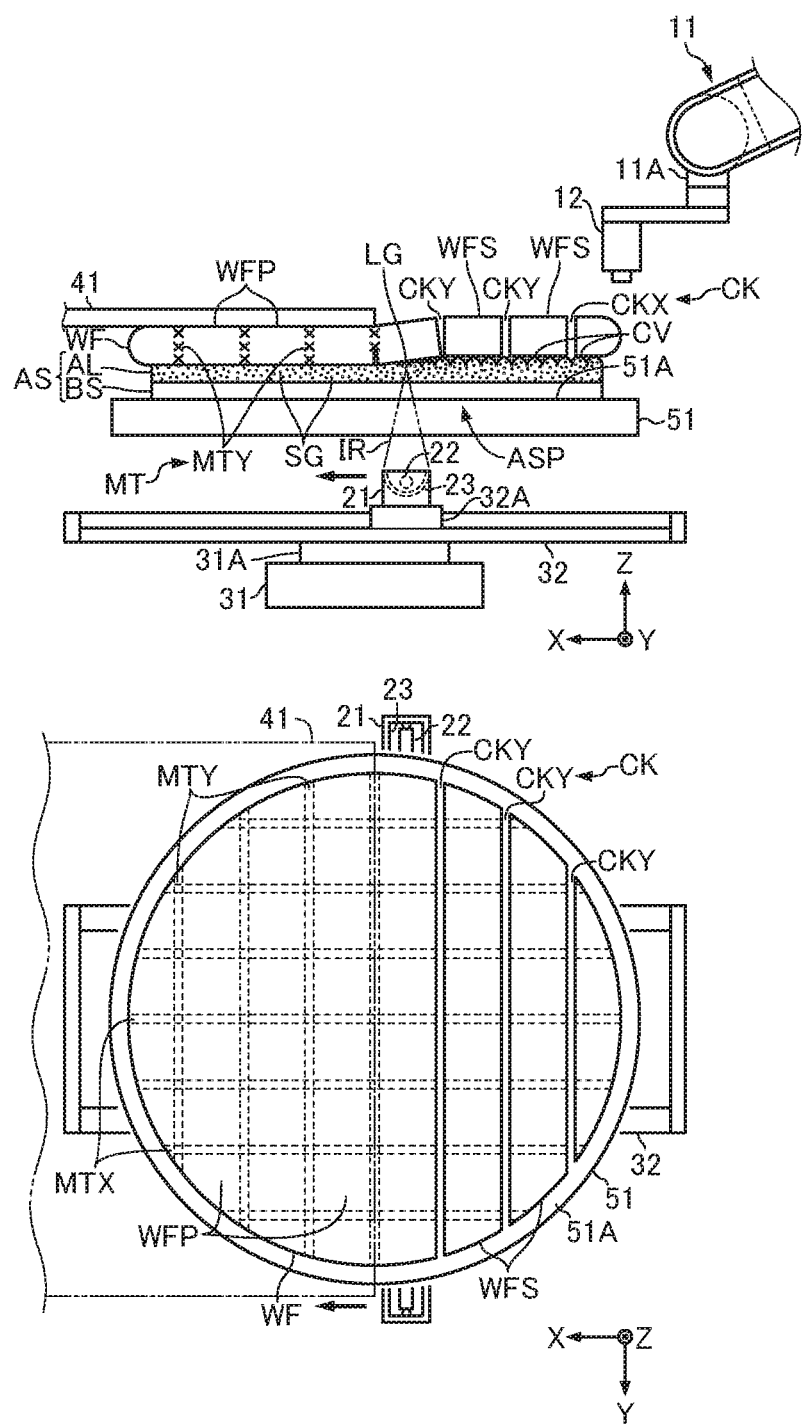
FIG. 1C is an explanatory view of the discrete piece forming device according to the embodiment.

Thereafter, the dividing unit 20 and the moving unit 30 drive the light emitter 22 and the linear motor 32, and after the line-shaped application area LG extending in the Y-axis direction is formed, the light source box 21 is moved from right to left as illustrated in FIG. 1C. As a result, the swell grains SG contained in the adhesive sheet parts ASP to which the infrared rays IR have been applied swell one after another as illustrated in FIG. 1C, so that innumerable convexities CV are formed on the adhesive layer AL. Consequently, the wafer WF is displaced up successively in order from its right parts to its left parts, so that cracks CKY extending in the Y-axis direction are formed with the first modified parts MTY serving as starting points, and strip-shaped wafers WFS extending in the Y-axis direction are formed. At this time, the displacement inhibiting unit 40 drives a not-illustrated drive device to place the hold plate 41 over the predefined discrete piece areas WFP whose displacement is not intended. This can inhibit the predefined discrete piece areas WFP adjacent to the displaced predefined discrete piece areas WFP from being displaced together, making it possible to prevent a failure to form the cracks CK starting from the modified parts MT.

Next, when the light source box 21 reaches a predetermined position on the left of the left end of the wafer WF, the dividing unit 20 and the moving unit 30 stop driving the light emitter 22 and the linear motor 32. Note that, in this embodiment, when forming the cracks CKY in the above-described manner, the dividing unit 20 radiates the infrared rays IR such that each of the swell grains SG contained in the adhesive sheet parts ASP irradiated with the infrared rays IR does not completely expand or such that not all of the swell grains SG contained in the adhesive sheet parts ASP irradiated with the infrared rays IR swell.

Figure 1D:
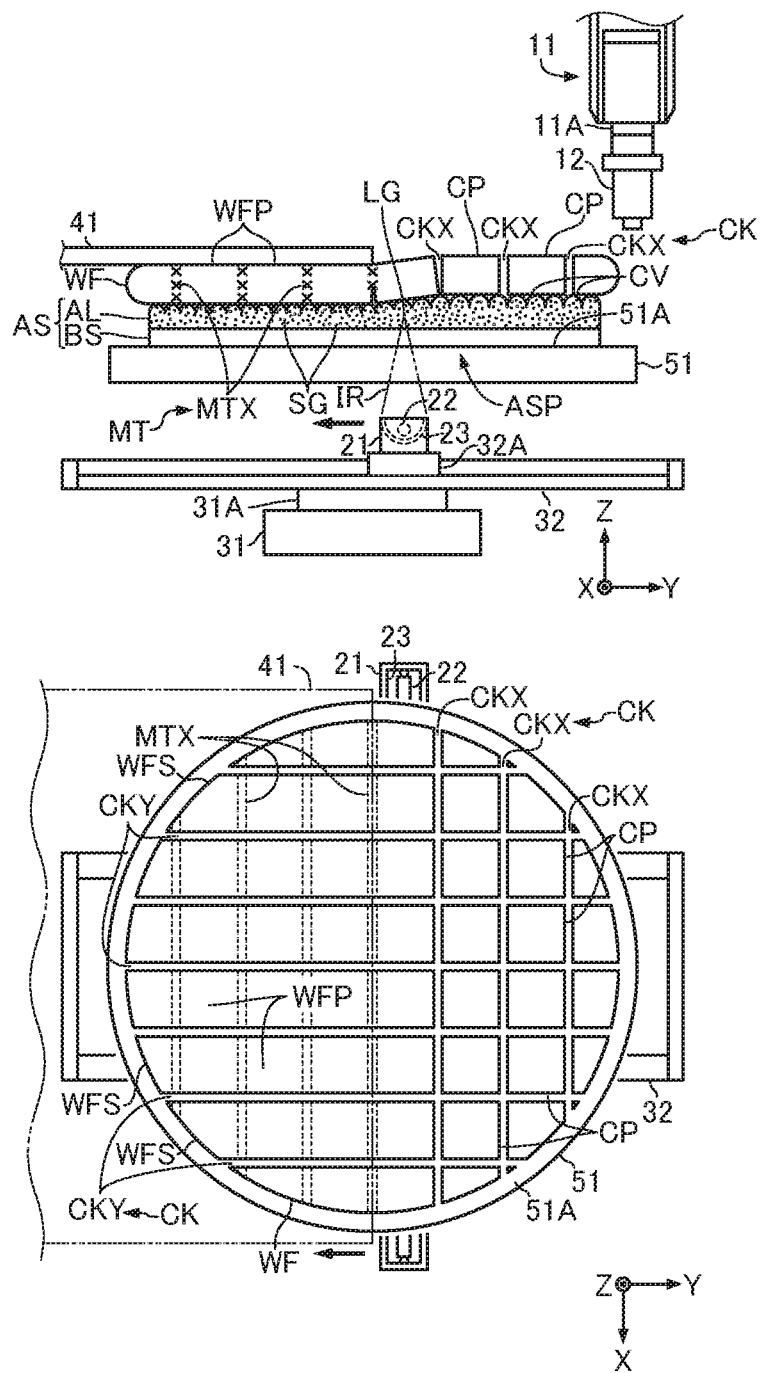
FIG. 1D is an explanatory view of the discrete piece forming device according to the embodiment.

Then, the moving unit 30 drives the rotary motor 31 to rotate the dividing unit 20 by 90 degrees in an XY plane. Next, the dividing unit 20 and the moving unit 30 drive the light emitter 22 and the linear motor 32, and after the line-shaped application area LG extending in the X-axis direction is formed, the light source box 21 is moved from the front side toward the rear side as illustrated in FIG. 1D. Consequently, as illustrated in FIG. 1D, the swell grains SG contained in the adhesive sheet parts ASP irradiated with the infrared rays IR swell to a greater size one after another, or a larger number of the swell grains SG contained in the adhesive sheet parts ASP irradiated with the infrared rays IR swell, so that the innumerable convexities CV formed in the adhesive layer AL are enlarged. Consequently, the strip-shaped wafers WFS are partly displaced up one after another in order from the front-side ones to the rear-side ones, so that cracks CKX extending in the X-axis direction are formed with the second modified parts MTX serving as starting points, and the plurality of chips CP each surrounded by the cracks CKX and the previously formed cracks CKY are formed. At this time as well, the displacement inhibiting unit 40 preferably drives the not-illustrated drive device to place the hold plate 41 over the predefined discrete piece areas WFP whose displacement is not intended.

Thereafter, when the light source box 21 reaches a predetermined position on the rear side of a rear end of the wafer WF, the dividing unit 20 stops driving the light emitter 22, and then the moving unit 30 drives the linear motor 32 to return the light source box 21 to the initial position. Next, the not-illustrated chip carrier unit such as a pickup device or a holding device or the user detaches all the chips CP or a predetermined number of the chips CP from the adhesive sheet AS and carries the chips CP to another process. Then, after the wafer support unit 50 stops driving the not-illustrated pressure-reducing unit, the user or the not-illustrated carrier unit removes the adhesive sheet AS from the support table 51, and the same operation as above is thereafter repeated.

It is possible to easily detach the chips CP from the adhesive sheet AS even if the adhesive sheet AS has a strong adhesion to the chips CP (wafer WF) because, owing to the innumerable convexities, the adhesion area of the adhesive sheet AS to the chips CP is reduced and accordingly, its adhesion to the chips CP is reduced.

The embodiment described above forms the chips CP by displacing the predefined discrete piece areas WFP by swelling the contained swell grains SG, and thus is capable of preventing the complication of the device.

The invention is by no means limited to the above units and processes as long as the above operations, functions, or processes of the units and processes are achievable, still less to the above merely exemplary structures and processes described in the exemplary embodiment. For instance, the modified part forming unit may be any modified part forming unit within the technical scope in light of the common general technical knowledge at the time of the filing of the application as long as it is capable of forming the modified parts in the work to form, in the work, the predefined discrete piece areas each surrounded by the modified parts or surrounded by the modified parts and an outer edge of the work (the same applies to other units and steps).

When the modified part forming unit 10 forms the modified parts MT in the wafer WF, the wafer WF may be moved while the laser irradiator 12 is not moved or is moved. The modified part forming unit 10 may form one modified part MT parallel to the X-axis or the Y-axis, may form one modified part MT or more not parallel to the X-axis or the Y-axis, may form a plurality of modified parts MT at uneven intervals, may form a plurality of modified parts MT parallel or not parallel to each other, may form a plurality of modified parts MT not intersecting with each other, may form a plurality of modified parts MT orthogonally or obliquely intersecting with each other, and may form one curved or folded-line shaped modified part MT or more. The predefined discrete piece areas WFP and the chips CP formed by such modified parts MT may be in any shape such as a circular shape, an elliptical shape, or a polygonal shape such as a triangular shape, a quadrangular shape, or a more sided polygonal shape. The modified part forming unit 10 may form one modified part MT or more in one different direction or in each of two different directions or more besides the first and second directions.

To form the modified parts MT, the modified part forming unit 10 may embrittle, pulverize, liquefy, or hollow the wafer WF by changing the characteristics, properties, nature, material, composition, structure, size, or the like of the wafer WF by applying laser light, an electromagnetic wave, vibration, heat, chemicals, a chemical substance, or the like. Such modified parts MT may be any as long as they make it possible to divide the work into pieces using the swelling of the swell grains SG as external force to form the discrete piece.

If the modified parts MT are formed in the wafer WF beforehand, the discrete piece forming device EA need not include or may include the modified part forming unit 10.

Figure 2A:
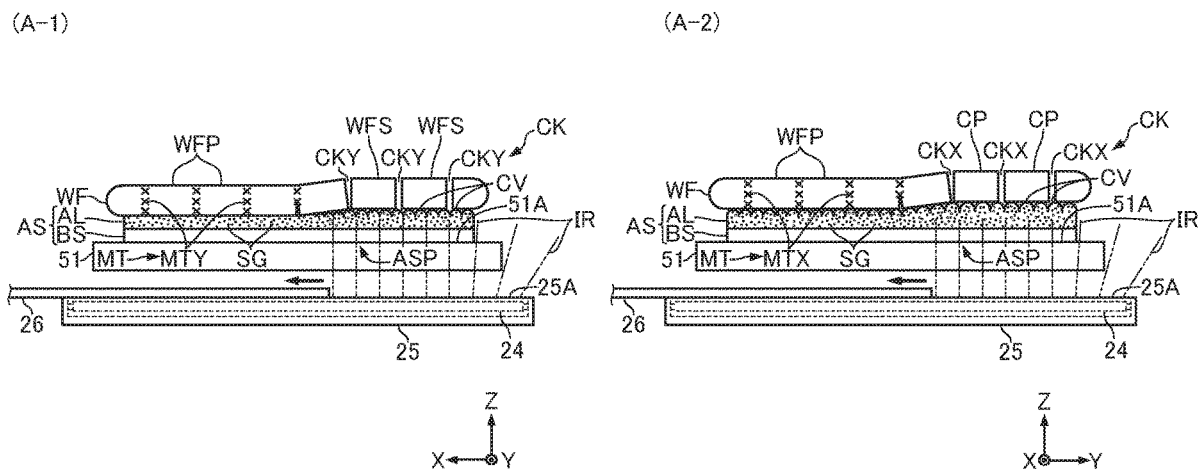
FIG. 2A is an explanatory view of a modified example.
Figure 2B:
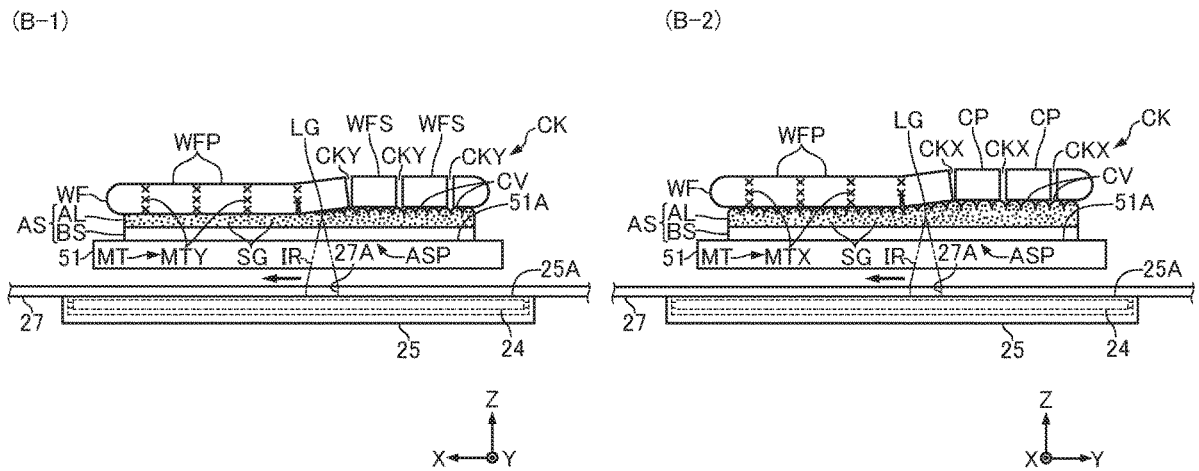
FIG. 2B is an explanatory view of a modified example.

As illustrated in FIG. 2A, the dividing unit 20 may include a light emitter 24 capable of applying the infrared rays IR to the whole adhesive sheet AS at a time, a reflector plate 25 reflecting the infrared rays IR emitted by the light emitter 24, and an opening/closing plate 26 capable of opening/closing an opening 25A provided at the top of the reflector plate 25. In this case, the dividing unit 20 forms the cracks CKY one after another in order from the right ones to the left ones as illustrated in (A-1) in FIG. 2A while gradually moving the opening/closing plate 26, which completely closes the opening 25A at first, from right toward left, thereby forming the strip-shaped wafers WFS extending in the Y-axis direction. Next, after the dividing unit 20 is rotated by 90 degrees in the XY plane, it forms the cracks CKX one after another in order from the front ones to the rear ones as illustrated in (A-2) in FIG. 2A while gradually moving the opening/closing plate 26, which completely closes the opening 25A at first, from the front side toward the rear side, thereby forming the chips CP each surrounded by the cracks CKX and the cracks CKY. In this case, instead of the opening/closing plate 26, usable is an opening/closing plate 27 including a slit 27A through which the infrared rays IR emitted by the light emitter 24 are applied to form the line-shaped application area LG as illustrated in (B-1) and (B-2) in FIG. 2B. In the slit 27A, a lens that condenses or collimates the infrared rays IR may be provided.

The dividing unit 20 does not necessarily have to include the condenser plate 23 or the reflector plate 25, and may include a lens that condenses or collimates the infrared rays IR, instead of or in addition to the condenser plate 23. The irradiation duration of the adhesive sheet AS with the infrared rays IR may be decided appropriately in consideration of the characteristics, properties, nature, material, composition, structure, and so on of the swell grains SG. The light emitters 22, 24 of the dividing unit 20 each may be a LED (Light Emitting Diode) lamp, a high-pressure mercury lamp, a low-pressure mercury lamp, a metal halide lamp, a xenon lamp, a halogen lamp, or the like, or may be an appropriate combination of these. The dividing unit 20 may be one that applies, as the energy, laser light, an electromagnetic wave, vibration, heat, chemicals, a chemical substance, or the like or an appropriate combination of these. The configuration of the dividing unit 20 may be decided appropriately in consideration of the characteristics, properties, nature, material, combination, structure, and so on of the swell grains SG. If the work is able to transmit the predetermined energy, the dividing unit 20 may apply the predetermined energy from the work side, from the adhesive sheet AS side, or from both of the work side and the adhesive sheet AS side.

The dividing unit 20 may, for example, apply the infrared rays IR only to part of the adhesive sheet part ASP corresponding to one section or more at an optional position or more out of the predefined discrete piece areas WFP, thereby displacing the predefined discrete piece areas WSP composed of the one section or more attached to the adhesive sheet part ASP, thereby forming the chips CP.

In this embodiment, the dividing unit 20 forms the line-shaped application area LG and applies the infrared rays IR to parts of the adhesive sheet AS, but the dividing unit 20 may form a dotted application area so that the application area of the infrared rays IR becomes dotted, and apply the infrared rays IR to parts of the adhesive sheet AS, or may form a planar application area corresponding or not corresponding to the planar shape of the predefined discrete piece areas WFP and apply the infrared rays IR to parts of the adhesive sheet AS.

Figure 2C:
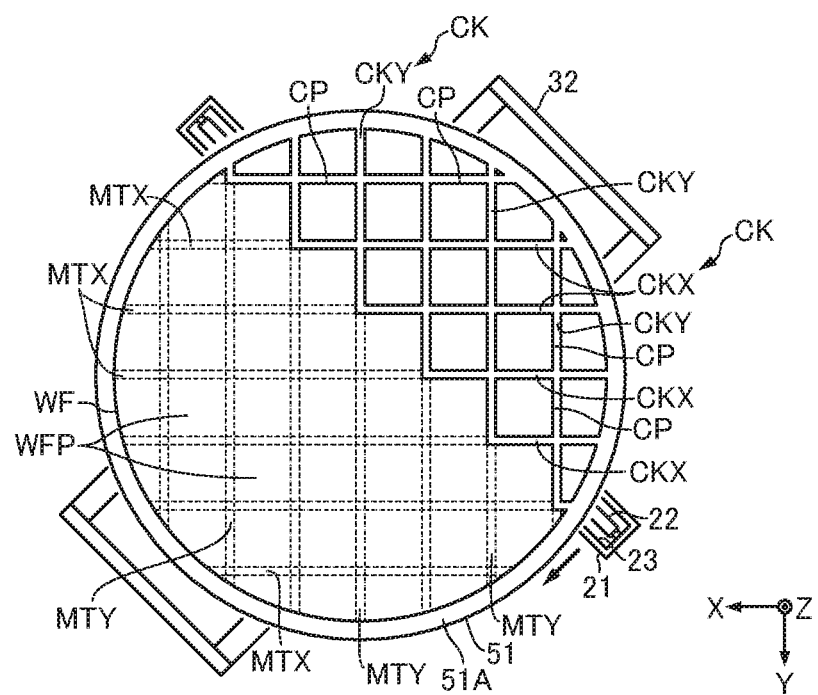
FIG. 2C is an explanatory view of a modified example.

As illustrated in FIG. 2C, the moving unit 30 may move a line-shaped application area LG (not illustrated) obliquely intersecting with the first modified parts MTY and the second modified parts MTX from one end toward the other end of the wafer WF so that the cracks CKY, CKX starting both from the first and second modified parts MTY, MTX are formed simultaneously to form the chips CP. The oblique intersection angle in this case may be any, and for example, may be 1 degree, 5 degrees, 10 degrees, 45 degrees, 60 degrees, 89 degrees, or the like to the X-axis direction.

The wafer WF may be moved while the dividing unit 20 is moved or is not moved by the moving unit 30 when the wafer WF is rotated by 90 degrees in the XY plane relative to the dividing unit 20, and when the line-shaped application area LG is moved to be parallel to the Y-axis direction and to be parallel to the X-axis direction, or when the line-shaped application area LG is moved not to be parallel to the X-axis or Y-axis direction. The moving unit 30 may be a structure included in the discrete piece forming device EA, or if another device moves at least one of the wafer WF and the dividing unit 20, the moving unit 30 need not be included in the discrete piece forming device EA.

The displacement inhibiting unit 40 may place the hold plate 41 in contact or in non-contact with the tops of the predefined discrete piece areas WFP whose displacement is not intended. The displacement inhibiting unit 40 may inhibit the displacement of the wafer WF that has not yet been displaced by the dividing unit 20 by a different method such as by spraying gas or by pulleys and a belt. The discrete piece forming device EA does not necessarily have to include the displacement inhibiting unit 40.

The wafer support unit 50 may include a plate-shaped member (holding member) such as an iron plate or a glass plate pasted on the base BS side and support the wafer WF by the plate-shaped member. If the work is unable to transmit the predetermined energy, the support table 51 or the plate-shaped member is one that is able to transmit the predetermined energy. If the work is able to transmit the predetermined energy, the support table 51 or the plate-shaped member may be one that is unable or is able to transmit the predetermined energy.

The wafer support unit 50 may be one without the holding unit. The wafer support unit 50 may be provided as a structure included in the discrete piece forming device EA, or if another device supports the wafer WF, the discrete piece forming device EA need not include the wafer support unit 50.

For example, the swell grains SG may include not-illustrated first swell grains that are swollen by 80° C. heat as predetermined first energy and not-illustrated second swell grains that are swollen by 100° C. heat as predetermined second energy. In this case, the dividing unit 20 includes: a first dividing unit that applies 80° C. heat as the first energy and a second dividing unit that applies 100° C. heat as the second energy. In this case, the dividing unit 20 is capable of forming the chips CP by forming the cracks CKY starting from the first modified parts MTY by applying the 80° C. heat and thereafter forming the cracks CKX starting from the second modified parts MTX by applying the 100° C. heat, by the same operation as that of the above-described embodiment. The first energy and the second energy may be heat at any temperature. If the swell grains SG include other swell grains that are swollen by heat at a temperature different from those of the first energy and the second energy, the dividing unit 20 may further include another dividing unit that applies the heat at this different temperature.

Further, the swell grains SG contained in the adhesive sheet AS may include not-illustrated first swell grains that are swollen by infrared rays as first energy and not-illustrated second swell grains that are swollen by ultraviolet rays as second energy. In this case, the dividing unit 20 may form the chips CP by forming the cracks CKY starting from the first modified parts MTY by applying the infrared rays and thereafter forming the cracks CKX starting from the second modified parts MTX by applying the ultraviolet rays, by the same operation as that of the above-described embodiment. The combination of the first energy and the second energy may be any combination of those out of electromagnetic waves such as infrared rays, ultraviolet rays, visible rays, an acoustic wave, X rays, and gamma rays, hot water, hot air, and so on, depending on the combination of the not-illustrated first and second swell grains contained in the adhesive sheet AS. If the adhesive sheet AS contains other swell grains that are swollen by different energy from the first energy and the second energy, the dividing unit 20 may further include another dividing unit that applies the different energy.

Further, in the above-described embodiment, the line-shaped application area LG is gradually moved from one end toward the other end of the wafer WF, but to form the cracks CK starting from the modified parts MT, the dividing unit 20 may be moved such that the line-shaped application area LG is located only at a position where the modified part MT is formed, or the light emitter 22 or 24, which has been kept off, may be driven after the dividing unit 20 or the slit 27A is moved such that the line-shaped application area LG is located only at the position where the modified part MT is formed.

Further, the swell grains SG contained in the adhesive sheet AS may be those that swell when exposed to an electromagnetic wave such as ultraviolet rays, visible rays, an acoustic wave, X-rays, or gamma rays, heat of hot water or hot air, or the like as the predetermined energy. The dividing unit 20 may be any as long as it can divide the work into pieces to form the discrete pieces by swelling the swell grains SG in consideration of the characteristics, properties, nature, material, composition, structure, or the like of these swell grains SG.

In the adhesive sheet AS, the swell grains SG may be contained only in the base BS forming the adhesive sheet AS or may be contained in both of the adhesive layer AL and the base BS. The adhesive sheet AS may be one that further includes an intermediate layer between the adhesive layer AL and the base BS, with the swell grains SG contained in at least one or at least two of the intermediate layer, the adhesive layer AL, and the base BS. In the wafer WF, the adhesive sheet AS may be pasted on a surface on which a circuit is formed, may be pasted on a surface on which a circuit is not formed, or may be pasted on each of the surfaces. If the adhesive sheet AS is thus pasted on each of the surfaces of the wafer WF, these adhesive sheets AS may be the same or may be different, and it is also acceptable that one of the adhesive sheets does not contain the swell grains SG.

The discrete pieces are not limited to the chips CP, and for example, may be strip-shaped wafers WFS, and in this case, the predefined discrete piece areas are areas each surrounded by the first modified parts MTY and the outer edge of the wafer WF, and the moving unit 30 only need to move the line-shaped application area LG formed by the dividing unit 20 to make it parallel to the Y-axis direction, the X-axis direction, or another direction.

If the work is formed in the shape of the strip-shaped wafer WFS beforehand, the moving unit 30 may move the line-shaped application area LG formed by the dividing unit 20 to make it parallel only to the X-axis direction, the Y-axis direction, or the other direction at the time of the formation of the chips CP.

As the swell grains SG, grains each having an elastic shell encapsulating a substance, such as isobutane, propane, or pentane, that is easily gasified to swell by heat can be exemplified, and examples of the swell grains SG include, but are not limited to, the thermally foamable grains disclosed in Japanese Patent Application No. 2017-73236, Japanese Patent Application Laid-open No. 2013-159743, Japanese Patent Application Laid-open No. 2012-167151, Japanese Patent Application Laid-open No. 2001-123002, and so on which are explicitly incorporated in the present specification by reference and swell grains disclosed in Japanese Patent Application Laid-open No. 2013-47321, Japanese Patent Application Laid-open No. 2007-254580, Japanese Patent Application Laid-open No. 2011-212528, Japanese Patent Application Laid-open No. 2003-261842, and so on which are explicitly incorporated in the present specification by reference. For example, a foaming agent that generates water, carbonic acid gas, or nitrogen through pyrolysis to exhibit a similar effect to that of the swell grains may be adopted. Also adoptable are those whose shells are swollen by a gas generating agent such as an azo compound which generates gas when exposed to ultraviolet rays, as disclosed in Japanese Patent Application Laid-open No. 2016-53115 and Japanese Patent Application Laid-open No. H07-278333 which are explicitly incorporated in the present specification by reference, or for example, those that are swollen by heating, such as rubber or resin, or baking soda, sodium acid carbonate, baking powder, or the like.

The swell grains SG may be those swollen by the application of an electromagnetic wave such as ultraviolet rays, visible rays, an acoustic wave, X-rays, or gamma rays, or heat of hot water or hot air as the predetermined energy, instead of the infrared rays, and the unit that applies the energy may be selected according to the characteristics, properties, nature, material, composition, structure, and so on of such swell grains SG.

In the wafer WF, a circuit may be formed on at least one of one surface and the other surface, or it is also acceptable that a circuit is formed on neither of these surfaces.

The discrete piece forming device EA may include a known sheet pasting unit which pastes the adhesive sheet AS on the wafer WF, may include a known polishing (grinding) unit which polishes (grinds) the wafer WF to a predetermined thickness, may include a known pickup unit which detaches the chips CP from the adhesive sheet AS, and may include a known bonding unit which bonds the chips CP detached from the adhesive sheet AS to another member such as a substrate or a mount.

The materials, types, shapes, and so on of the adhesive sheet AS and the work in the present invention are not limited. For example, the adhesive sheet AS may be in a circular shape, an elliptical shape, a polygonal shape such as a triangular shape or a quadrangular shape, or any other shape, and may be of a pressure-sensitive bonding type or a heat-sensitive bonding type. If the adhesive sheet AS is of the heat-sensitive bonding type, it may be bonded by an appropriate method, for example, by an appropriate heating unit for heating the adhesive sheet AS, such as a coil heater or a heating side of a heat pipe. Further, such an adhesive sheet AS may be, for example, a single-layer adhesive sheet having only the adhesive layer AL, an adhesive sheet having an intermediate layer between the base BS and the adhesive layer AL, a three or more-layer adhesive sheet having a cover layer on the upper surface of the base BS, or an adhesive sheet such as what is called a double-faced adhesive sheet in which the base BS can be released from the adhesive layer AL. The double-faced adhesive sheet may be one having one intermediate layer or more, or may be a single-layer one or a multilayer one not having an intermediate layer. Further, the work may be, for example, a single item such as food, a resin container, a semiconductor wafer such as a silicon semiconductor wafer or a compound semiconductor wafer, a circuit board, an information recording substrate such as an optical disk, a glass plate, a steel sheet, pottery, a wood board, or a resin, or may be a composite made up of two of these and more, and it may also be a member, an article, or the like of any form. The adhesive sheet AS may be read as one indicating its function or application, and may be, for example, any sheet, film, tape, or the like such as an information entry label, a decoration label, a protect sheet, a dicing tape, a die attach film, a die bonding tape, or a recording layer forming resin sheet.

The drive device in the above-described embodiment may be an electric machine such as a rotary motor, a direct-acting motor, a linear motor, a uniaxial robot, a multi-joint robot having two joints or three or more joints, an actuator such as an air cylinder, a hydraulic cylinder, a rodless cylinder, or a rotary cylinder, or the like, or may be one in which some of these are directly or indirectly combined.

In the above-described embodiment, in a case where a member, such as a support (holding) unit or a support (holding) member, that supports or holds a member to be supported is adopted, the member to be supported may be supported (held) by a gripping unit such as a mechanical chuck or a chuck cylinder, Coulomb force, an adhesive (adhesive sheet, adhesive tape), a tackiness agent (tacky sheet, tacky tape), magnetic force, Bernoulli adsorption, suction/adsorption, a drive device, or the like.

What is claimed is:

1. A discrete piece forming device comprising:
   a modified part forming unit which forms a modified part in a work having a pre-pasted adhesive sheet containing a swell grain which swells by application of a predetermined energy, the modified part being a part of the work where a property of the work is modified but the work is not cut apart, thereby defining, in the work, a predefined discrete piece area surrounded by the modified part or surrounded by the modified part and an outer edge of the work, while leaving the work as a substantially single body without dividing the work until a crack is formed in the work; and
   a dividing unit which divides the work by forming, in the work, the crack starting from the modified part by applying external force to the work, to form a discrete piece,
   wherein the dividing unit applies the energy to a part of the adhesive sheet to swell the swell grain contained in the part of the adhesive sheet to which the energy has been applied, thereby displacing the predefined discrete piece area pasted on the part of the adhesive sheet to form the discrete piece.

2. The discrete piece forming device of claim 1, further comprising a moving unit by which the work and the dividing unit move with respect to each other.

3. The discrete piece forming device of claim 2, wherein the modified part includes a first modified part extending along a first direction and a second modified part extending along a second direction intersecting with the first direction,
   wherein the dividing unit is configured to form a line-shape application area in which an application area of the energy extends in a predetermined direction, at a position to which the energy is applied, and
   wherein the moving unit moves the line-shaped application area to make the line-shaped application area parallel to the first direction, and further moves the line-shaped application area to make the line-shaped application area parallel to the second direction.

4. The discrete piece forming device of claim 1,
   wherein the swell grain comprises:
     a first swell grain that is swollen by a first energy; and
     a second swell grain that is swollen by a second energy, and
   wherein the dividing unit comprises:
     a first dividing unit that applies the first energy; and
     a second dividing unit that applies the second energy.

5. The discrete piece forming device of claim 1, further comprising a displacement inhibiting unit which inhibits displacement of a part of the work that has not yet been displaced by the dividing unit.

6. The discrete piece forming device of claim 2,
   wherein the swell grain comprises:
     a first swell grain that is swollen by a first energy; and a second swell grain that is swollen by a second energy, and wherein the dividing unit comprises:
a first dividing unit that applies the first energy; and
a second dividing unit that applies the second energy.

7. The discrete piece forming device of claim 2, further comprising a displacement inhibiting unit which inhibits displacement of a part of the work that has not yet been displaced by the dividing unit.

8. The discrete piece forming device of claim 3, further comprising a displacement inhibiting unit which inhibits displacement of a part of the work that has not yet been displaced by the dividing unit.

9. The discrete piece forming device of claim 4, further comprising a displacement inhibiting unit which inhibits displacement of a part of the work that has not yet been displaced by the dividing unit.

10. The discrete piece forming device of claim 6, further comprising a displacement inhibiting unit which inhibits displacement of a part of the work that has not yet been displaced by the dividing unit.

11. The discrete piece forming device of claim 3, wherein the swell grain comprises:
a first swell grain that is swollen by a first energy; and
a second swell grain that is swollen by a second energy, and wherein the dividing unit comprises:
a first dividing unit that applies the first energy; and
a second dividing unit that applies the second energy.

12. The discrete piece forming device of claim 11, further comprising a displacement inhibiting unit which inhibits displacement of a part of the work that has not yet been displaced by the dividing unit.

13. A discrete piece forming device comprising:
a dividing unit which divides a work by forming a crack in the work, to form a discrete piece, the work having (i) a pre-pasted adhesive sheet containing a swell grain which swells by application of a predetermined energy, (ii) a modified part, which is a part of the work where a property of the work is modified but the work is not cut apart, and (iii) a predefined discrete piece area surrounded by the modified part or surrounded by the modified part and an outer edge of the work in a state in which the work remains as a substantially single body without being divided until the crack is formed in the work, and the dividing unit forming the crack in the work with the modified part serving as a starting point by applying external force to the work,
wherein the dividing unit applies the energy to a part of the adhesive sheet to swell the swell grain contained in the part of the adhesive sheet to which the energy has been applied, thereby displacing the predefined discrete piece area pasted on the part of the adhesive sheet to form the discrete piece.

14. The discrete piece forming device of claim 13, further comprising a moving unit by which the work and the dividing unit move with respect to each other.

15. The discrete piece forming device of claim 14, wherein the modified part includes a first modified part extending along a first direction and a second modified part extending along a second direction intersecting with the first direction,
wherein the dividing unit is configured to form a line-shape application area in which an application area of the energy extends in a predetermined direction, at a position to which the energy is applied, and wherein the moving unit moves the line-shaped application area to make the line-shaped application area parallel to the first direction, and further moves the line-shaped application area to make the line-shaped application area parallel to the second direction.

16. The discrete piece forming device of claim 13,
wherein the swell grain comprises:
a first swell grain that is swollen by a first energy; and
a second swell grain that is swollen by a second energy, and wherein the dividing unit comprises:
a first dividing unit that applies the first energy; and
a second dividing unit that applies the second energy.

17. The discrete piece forming device of claim 13, further comprising a displacement inhibiting unit which inhibits displacement of a part of the work that has not yet been displaced by the dividing unit.

18. The discrete piece forming device of claim 14,
wherein the swell grain comprises:
a first swell grain that is swollen by a first energy; and
a second swell grain that is swollen by a second energy, and wherein the dividing unit comprises:
a first dividing unit that applies the first energy; and
a second dividing unit that applies the second energy.

19. The discrete piece forming device of claim 14, further comprising a displacement inhibiting unit which inhibits displacement of a part of the work that has not yet been displaced by the dividing unit.

20. The discrete piece forming device of claim 15, further comprising a displacement inhibiting unit which inhibits displacement of a part of the work that has not yet been displaced by the dividing unit.

21. The discrete piece forming device of claim 16, further comprising a displacement inhibiting unit which inhibits displacement of a part of the work that has not yet been displaced by the dividing unit.

22. The discrete piece forming device of claim 18, further comprising a displacement inhibiting unit which inhibits displacement of a part of the work that has not yet been displaced by the dividing unit.

23. The discrete piece forming device of claim 15,
wherein the swell grain comprises:
a first swell grain that is swollen by a first energy; and
a second swell grain that is swollen by a second energy, and wherein the dividing unit comprises:
a first dividing unit that applies the first energy; and
a second dividing unit that applies the second energy.

24. The discrete piece forming device of claim 23, further comprising a displacement inhibiting unit which inhibits displacement of a part of the work that has not yet been displaced by the dividing unit.

25. A discrete piece forming method comprising:
forming a modified part in a work having a pre-pasted adhesive sheet containing a swell grain which swells by application of a predetermined energy, the modified part being a part of the work where a property of the work is modified but the work is not cut apart, thereby defining, in the work, a predefined discrete piece area surrounded by the modified part or surrounded by the modified part and an outer edge of the work, while leaving the work as a substantially single body without dividing the work until a crack is formed in the work; and dividing the work by forming, in the work, the crack starting from the modified part by applying external force to the work, to form a discrete piece, wherein the dividing includes applying the energy to a part of the adhesive sheet to swell the swell grain contained in the part of the adhesive sheet to which the energy has been applied, thereby displacing the predefined discrete piece area pasted on the part of the adhesive sheet to form the discrete piece.

26. A discrete piece forming method comprising:

dividing a work by forming a crack in the work, to form a discrete piece, the work having (i) a pre-pasted adhesive sheet containing a swell grain which swells by application of a predetermined energy, (ii) a modified part, which is a part of the work where a property of the work is modified but the work is not cut apart, and (iii) a predefined discrete piece area surrounded by the modified part or surrounded by the modified part and an outer edge of the work in a state in which the work remains as a substantially single body without being divided until the crack is formed in the work, and the dividing forming the crack in the work with the modified part serving as a starting point by applying external force to the work, wherein the dividing includes applying the energy to a part of the adhesive sheet to swell the swell grain contained in the part of the adhesive sheet to which the energy has been applied, thereby displacing the predefined discrete piece area pasted on the part of the adhesive sheet to form the discrete piece.

* * * * *